United States Patent
Woo et al.

(10) Patent No.: US 7,843,127 B2
(45) Date of Patent: Nov. 30, 2010

(54) LIGHT EMITTING PANEL AND A LIGHT SOURCE FOR REDUCING DETERIORATION OF PIXEL

(75) Inventors: Kyoung Don Woo, Gunpo-si (KR); Hak Su Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/652,047

(22) Filed: Jan. 11, 2007

(65) Prior Publication Data

US 2008/0074035 A1    Mar. 27, 2008

(30) Foreign Application Priority Data

Sep. 22, 2006    (KR) .................... 10-2006-0092175

(51) Int. Cl.
*H01J 1/62* (2006.01)
*H01J 63/04* (2006.01)

(52) U.S. Cl. .................... 313/504; 313/508; 313/512; 445/24

(58) Field of Classification Search ................ 313/512, 313/507–511
See application file for complete search history.

(56) References Cited

U.S. PATENT DOCUMENTS 6,858,983 B2 * 2/2005 Mochizuki et al. .......... 313/512
2002/0155320 A1 * 10/2002 Park et al. .................... 428/690
2002/0180371 A1 * 12/2002 Yamazaki et al. ......... 315/169.3
2004/0043249 A1 * 3/2004 Su et al. ...................... 428/690
2004/0104673 A1 * 6/2004 Hosokawa et al. .......... 313/512
2004/0124770 A1 * 7/2004 Hayashi et al. ............. 313/512
2005/0040762 A1 * 2/2005 Kurihara ..................... 313/512
2005/0168143 A1 * 8/2005 Kum et al. .................. 313/512
2005/0227114 A1 * 10/2005 Tanaka et al. ............... 428/690
2005/0248270 A1 * 11/2005 Ghosh et al. ................ 313/512
2005/0248280 A1   11/2005 Hsieh et al.
2006/0125387 A1 * 6/2006 Adachi et al. ............... 313/506
2006/0187378 A1   8/2006 Bong et al.
2006/0202617 A1 * 9/2006 Yamada ....................... 313/512
2006/0216457 A1 * 9/2006 Takahashi et al. ............. 428/76
2006/0226773 A1 * 10/2006 Kim et al. .................... 313/512
2006/0246620 A1   11/2006 Nagayama et al. ............ 438/99

FOREIGN PATENT DOCUMENTS

CN    1395449 A    2/2003

* cited by examiner

*Primary Examiner*—Nimeshkumar D Patel
*Assistant Examiner*—Tracie Green
(74) *Attorney, Agent, or Firm*—Morgan Lewis & Bockius LLP

(57) ABSTRACT

In light emitting panel, the light emitting panel includes a substrate, a pixel part and a protection part. The pixel part has more than or equal to two unit parts separated from each other. The protection has a concave part marking off neighboring unit parts.

19 Claims, 4 Drawing Sheets

LIGHT EMITTING PANEL AND A LIGHT SOURCE FOR REDUCING DETERIORATION OF PIXEL

CROSS-REFERENCE

This application claims priority to and the benefit of Korea Patent Application No. 10-2006-0092175, filed on Sep. 22, 2006, the entire content of which is incorporated herein by reference.

BACKGROUND

1. Field

The present invention relates to a light emitting panel.

2. Related Art light emitting panel can emit variable colors and be formed by using thin film and be easily patterned. Furthermore, the light emitting panel has characteristics that are low driving voltage, high emission efficiency and self-emission display. Hence, the light emitting panel is vigorously researching branch of a flat panel display.

Especially, an organic electroluminescent panel has a pixel part, in which an organic emission layer is disposed between two electrodes. The organic electroluminescent panel has weakness for an air like as moisture, oxygen or ultraviolet light, etc. So, it is needed to an encapsulation structure to encapsulate the pixel part.

Furthermore, when the light emitting is driven during long time, the light emitting generates heat. Due to heat generated from driving the light emitting, the organic emission layer deteriorates.

Especially, in case that the light emitting panel is used as a lighting apparatus or a back light unit, a driving time and a brightness enhances such that deterioration of the organic emission layer is seriously more and more.

SUMMARY

Accordingly, the present invention provides a light emitting device to elongate durability by preventing deterioration of pixel part due to heat generated from driving of panel.

In one aspect of the present invention, the present invention includes a light emitting panel comprising: a substrate; pixel parts located apart from each other, formed on the substrate; and a protection part comprising an indented part, wherein the indented part is concaved toward the substrate.

The concave part may be separated from the substrate.

The light emitting panel may have a heat transmission part disposed on the substrate corresponding to the concave part of the protection part. The heat transmission part may contact with the concave part of the protection part.

The heat transmission part may have a getter. The protection part may have a metal, a glass or a plastic.

The unit part of the pixel part has at least one sub-pixel and the sub-pixel may have an emission part having an organic material between two electrodes.

The pixel part emits a white color.

The light emitting panel may be used for a lighting apparatus or a back light unit.

In another aspect of the present invention, the present invention includes a light source comprising: a substrate; pixel parts divided from each other, formed on the substrate; and a protection part comprising an indented part, wherein the indented part is concaved toward the substrate.

DETAILED DESCRIPTION OF AN EMBODIMENTS

Figure 1:
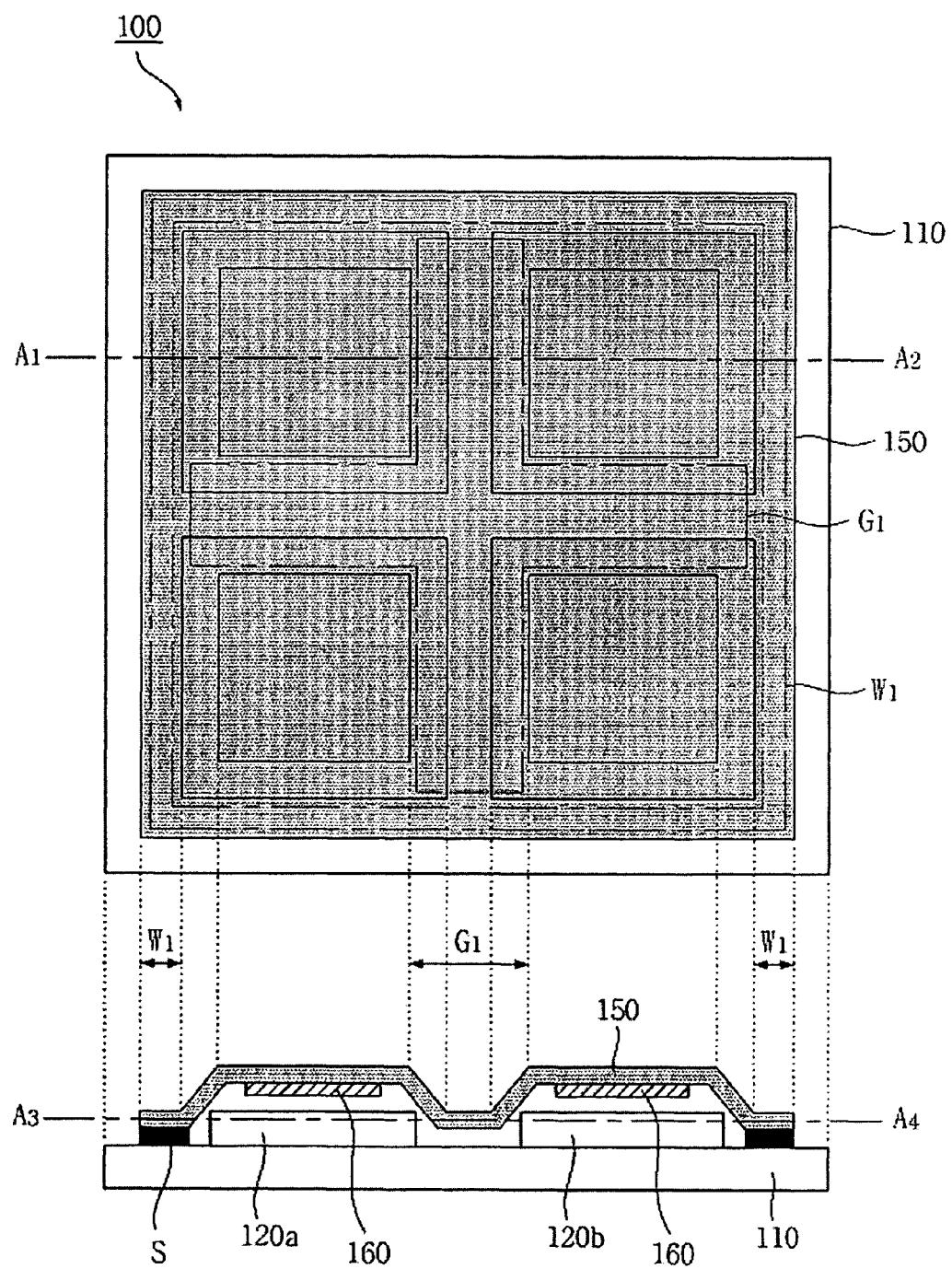
FIG. 1 is a plane view and a cross sectional view of a light emitting panel according to first embodiment of present invention.

An embodiment of the present invention will be described with reference to the accompanying drawings. However, the present invention is not limited to an embodiment described below, but may be embodied in a variety of forms. In the drawings, if it is mentioned that a layer is positioned on a different layer or a substrate, the layer may be formed directly on the different layer or the substrate, or another layer may be interposed there between. Like reference numerals designate like elements.

Figure 2:
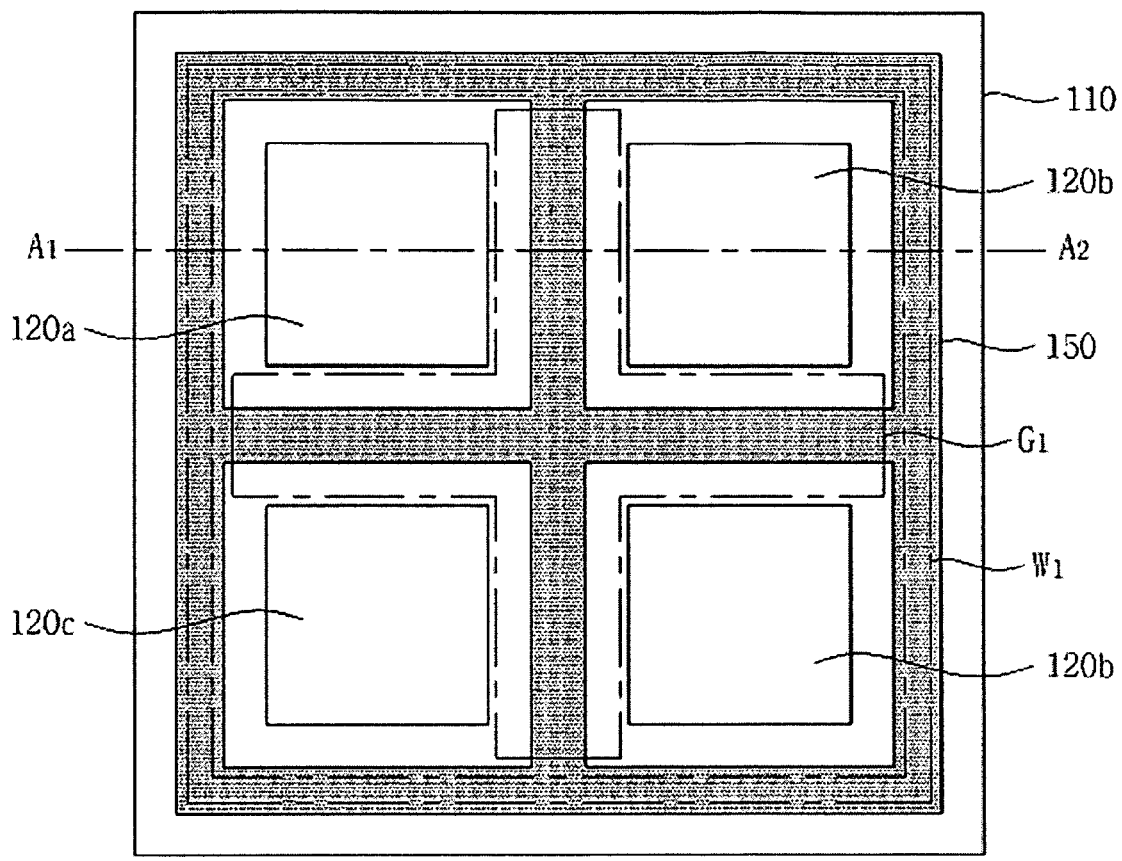
FIG. 2 is cross sectional view cutting along A3-A4 line of the cross section view of FIG. 1.

FIG. 1 is a plane view and a cross sectional view of a light emitting panel according to first embodiment of present invention. The cross sectional view of the FIG. 1 is viewing cutting along A1-A2 line of the plane view of the FIG. 1. FIG. 2 is cross sectional view cutting along A3-A4 line of the cross sectional view of FIG. 1.

Referring to FIG. 1 and FIG. 2, the light emitting panel according to the first embodiment of the present invention has a pixel part 120 disposed on a substrate 110.

The pixel part 120 is comprised of first unit part through fourth unit part 120a, 120b, 120c, 120d, and the first unit part through the fourth unit part 120a, 120b, 120c, 120d have plural sub-pixels respectively(not shown). The sub-pixel has an emission layer formed between two electrodes.

Although not shown in FIG. 1 and FIG. 2, structure of the sub-pixel is as follows.

A transparent first electrode with Indium-Tin-Oxide having high work function is formed on the substrate and the emission layer is formed on the first electrode. The emission may have an organic material and may have a red group, a green group, or a blue group. Especially, in case that the light emitting panel 100 according to the first embodiment of the present invention is used for a light apparatus or a back light unit, the emission layer may have a laminated structure with the red group and blue group, or a laminated structure with the red group, the green group and the blue group in order to emit white color.

Second electrode having a metal like as aluminum having low work function is formed on the emission layer. In case of a top-emission type or a dual-emission type, the second electrode may be formed as thin metal electrode or the thin metal electrode/transparent conduction film such that the second electrode is transparent.

Furthermore, a hole injection layer or a hole transmission layer may be disposed between the first electrode and the emission layer in order to easily transmit a hole. An electron injection layer or an electron transmission layer may be disposed between the emission layer and the second electrode.

As aforementioned, the first electrode is an anode and the second electrode is a cathode in the sub-pixel structure according to the first embodiment of the present invention. However, the structure of the pixel part is not limited as aforementioned, and position of the anode and the cathode may be changed and a materials composing of the anode and the cathode may be changed. Furthermore, the laminated structure or the number of color groups to embody the white color may be changed.

Referring to FIG. 1 and FIG. 2, the substrate 110 on which the pixel part 120 is formed is coupled with a protection part 150 in order to prevent the pixel part 120 from the moisture or the oxygen. The protection part 150 may be metal cap 150. The metal cap 150 encapsulates the substrate 110 using sealant S deposited on a sealing region W1. The protection part 150 may further have a getter 160 to absorb interior moisture.

The protection 150 is located corresponding to a region among the first unit part through the fourth part 120a, 120b, 120c, 120d, and has a concave part G1 depressed for the substrate 110.

The metal cap 150 having the concave part G1 has a large area to contact with an outside air, so that a heat generated from driving the light emitting panel is easily emitted.

In case that the structure of the metal cap 150 is plane or convex, the heat generated in the metal cap 150 generates convection current in an interior space defined by the metal cap 150. Thus, a greenhouse effect due to the convection current is generated such that the pixel part 120 gets damaged by the heat.

However, in case that the structure of the metal cap 150 is concave, the space between the pixel part 120 and the metal cap 150 is diminished, so that the convection current and the greenhouse effect due to heat generated in the space may be diminished. Furthermore, the metal cap 150 has the concave part G1 such that the metal cap 150 has a large area to contact with the outside air. Furthermore, a space on the concave part G1 is a pathway in which the outside air flows, so that the heat is effectively emitted.

As aforementioned, it is disclosed that the metal cap is used as the protection part 150 in the light emitting panel 100 according to the first embodiment of the present invention. However, the protection part is not limited as the metal cap applied to the light emitting panel according to the present invention.

Namely, when the light emitting panel according to the present invention is the top-emission type or the dual-emission type, the protection part may be comprised of a transparent material. For example, the protection is comprised of a glass or a plastic. Furthermore, the getter formed in the protection part may be a liquid phase getter or a transparent getter with high transmittance. When a getter with low transmittance is used, the getter may be located at an outside region of the pixel part where is non-emitting area, or may be located at a region on the substrate (referring to G1 of FIG. 1) corresponding to a region among respective unit parts of the pixel part.

Figure 3:
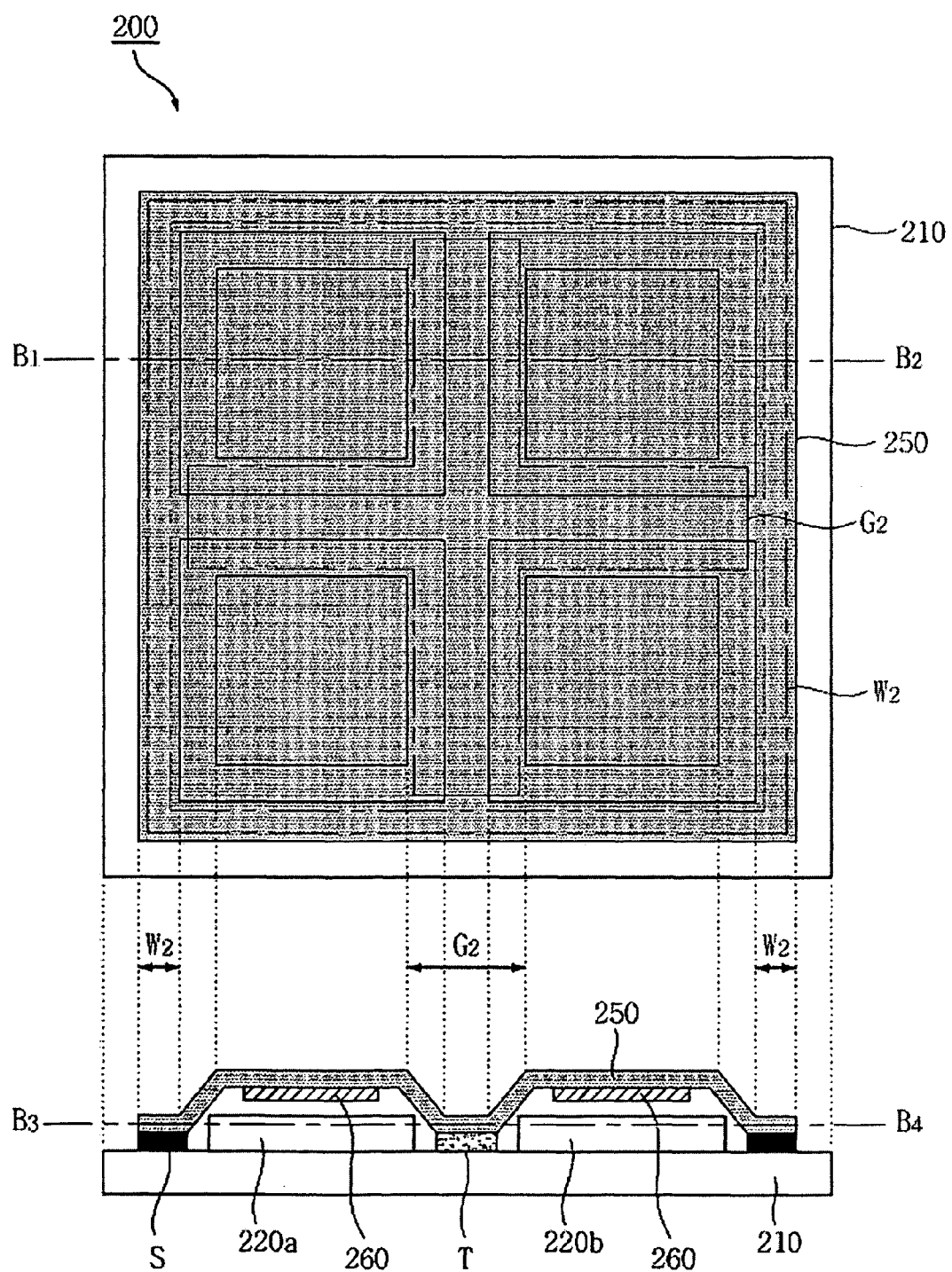
FIG. 3 is plane view and a cross sectional view of a light emitting panel according to second embodiment of the present invention.
Figure 4:
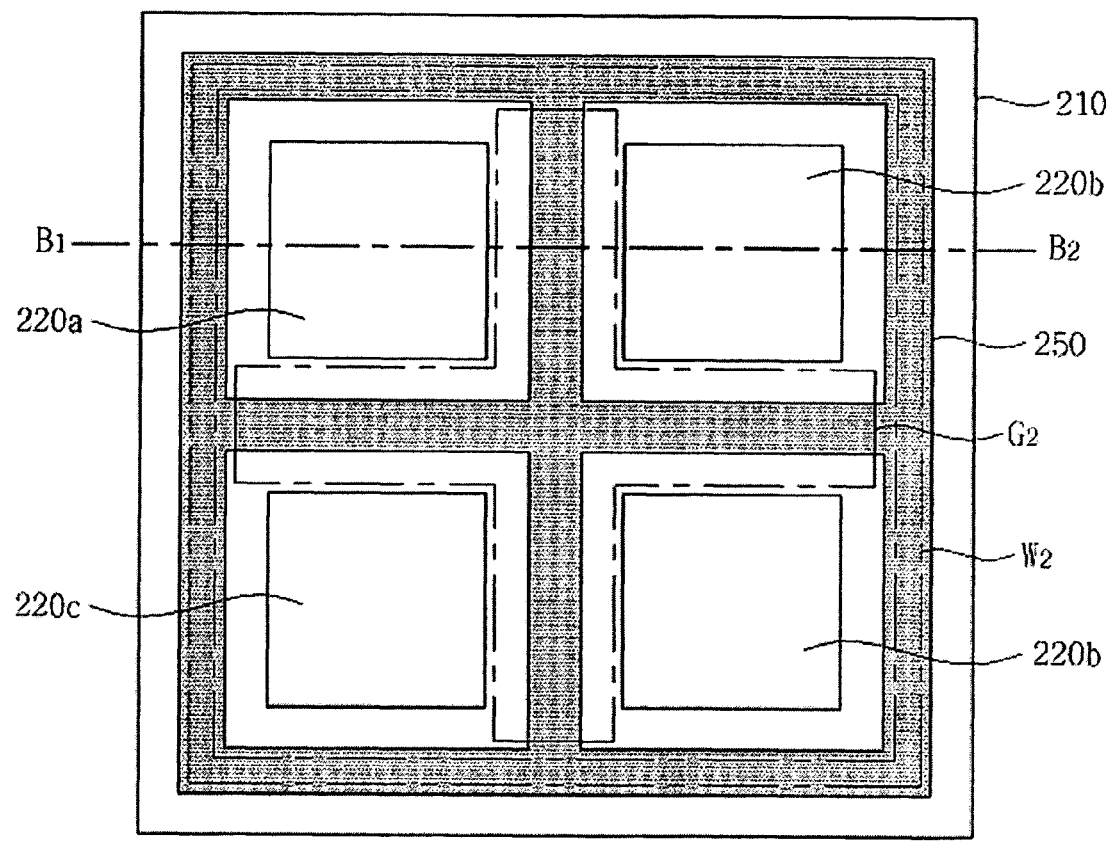
FIG. 4 is cross sectional view cutting the cross section view of FIG. 3 along B3-B4 line.

FIG. 3 is plane view and a cross sectional view of a light emitting panel according to second embodiment of the present invention. The cross sectional view of FIG. 3 is viewing cutting along B1-B2 line of the plane view of FIG. 3. FIG. 4 is cross sectional view cutting the cross sectional view of FIG. 3 along B3-B4 line.

Referring to FIG. 3 and FIG. 4, the light emitting panel 200 according to the second embodiment of the present invention has a pixel part 220 that is formed on a substrate 210 and has first unit part through fourth unit part 220a, 220b, 220c, 220d formed as the same method with the light emitting panel 100 of the first embodiment of the present invention.

The substrate 210 on which the pixel part 220 having sub-pixels is formed is coupled with a protection part 250 in order to isolate the pixel part 220 from an exterior moisture or an oxygen. The protection part 250 may be a metal cap. The metal cap 250 encapsulates the substrate 210 by using sealant S deposited on a sealing region W2. The protection part 250 may further have a getter 260 to absorb interior moisture.

The metal cap 250 is located corresponding to a region among the first unit part through the fourth part 220a, 220b, 220c, 220d, and has a concave part G2 depressed for the substrate 210.

Furthermore, a heat transmission part T is formed on the substrate 210. The heat transmission part T is disposed at a region corresponding to the concave part G2 and contact with the concave part G2 of the metal cap 250.

The heat transmission part T may a thermal pad. Furthermore, the heat transmission part T may be composed of a Cu or an Ag having high thermal conductivity, or may be composed of an alloy having the Cu or the Ag. Furthermore, the heat transmission part T may be composed of a material having a carbon like as a carbon nanotube.

As aforementioned, although the heat transmission part T is composed of the Cu, the Ag or the carbon nanotube, material of the heat transmission part T may use the other material besides the aforementioned materials.

Furthermore, in case that the heat transmission part T has the metal, the unit parts of the pixel part may be electrically short with each other, hence a insulation layer may is formed between the unit parts 220a, 220b, 220c, 220d or between the unit part and the heat transmission part T.

Furthermore, the heat transmission part T may be the thermal pad having the getter. For example, the getter may be disposed at a side or interior of the thermal pad, and may be deposited on a surface of the thermal pad.

When the thermal pad having the getter is used in the light emitting panel according to the present invention, first electrode, second electrode and the protection part may use a material having high transmittance, so that the light emitting panel according to the present invention may be used for the top-emission type or the dual-emission type.

The heat transmission part T may have the other pattern and material besides the aforementioned pattern and material. The heat transmission part T is separated from an emission region defined by the first unit part through the fourth unit part 220a, 220b, 220c, 220d of the pixel part 220. Regardless of number and shape, the heat transmission part T may be variably patterned on the substrate 210 enough to prevent from an electrical short among the first unit part through the fourth part 220a, 220b, 220c and 220d.

As aforementioned, the metal cap 250 is the concave part G2 and the space between the pixel part 220 and the metal cap 250 is diminished, so that the convection current and the greenhouse effect due to heat generated in the space may be diminished. Furthermore, the metal cap 250 has the concave part G2 such that the metal cap 250 has a large area to contact with the outside air. Furthermore, a space on the concave part G2 is a pathway in which the outside air flows, so that the heat is effectively emitted.

Furthermore, the light emitting panel 200 according to the second embodiment of the present invention adds the heat transmission part T to the light emitting panel 100 according to the first embodiment of the present invention, so that the light emitting panel 200 effectively emits the heat transmitted from a driving part to the substrate through the heat transmission part T and a driving heat generated from the pixel part 220 in the metal cap 250.

Furthermore, although the heat transmission part T of the light emitting panel 200 according to the second embodiment of the present invention contacts with the concave part of the metal cap 250 and the neighboring unit parts are separated from each other, the heat transmission part T may be at a distance from the metal cap 250.

In the second embodiment of the present invention, although the protection part 250 of the light emitting panel 200 is comprised of the metal cap, the protection part of the light emitting panel according to the present invention may use variable cap having material of predetermined thermal conductivity.

Furthermore, when the light emitting panel 200 according to the second embodiment of the present invention is the top-emission type or the dual-emission type, the protection part 250 may be composed of a transparent material. For example, the protection part 250 may be composed of a glass or a plastic. Furthermore, the getter 260 formed in the protection part 250 may be transparent liquid getter or transparent getter. In case that the getter 260 transmits poorly light, the getter 260 may be disposed on a position of the substrate 210 where is corresponding to a region between each unit parts 220a, 220b, 220c, 220d of the pixel part 220.

The light emitting panel of the present invention may be an active matrix type in which the light emitting panel has a thin film transistor connected to the first electrode.

Furthermore, although the four unit parts of the pixel part have the same size with each other, the light emitting panel according to the present invention may have different number of the unit part from aforementioned number and may have different size from each other.

Furthermore, the light emitting panel according to the present invention may be different emission direction from the top-emission type and the dual-emission type.

Furthermore, the emission layer of the pixel part according to the present invention may be composed of an organic material or an inorganic material.

According to the present invention, the pixel part is prevent from damage by heat generated from driving the panel, so that durability of the light emitting panel may elongate.

Although the present invention has been described with reference to certain exemplary embodiments, it will be understood by those skilled in the art that a variety of modifications and variations may be made to the present invention without departing from the spirit or scope of the present invention defined in the appended claims, and their equivalents.

What is claimed is:

1. A light emitting panel comprising:
   a substrate;
   pixel parts located apart from each other, formed on the substrate;
   a protection part comprising an indented part, wherein both ends of the protection part are coupled with the substrate on which the pixel parts are formed by sealants so that a space is for med between the pixel parts and the protection part, and the indented part is concaved corresponding to areas between the pixel parts toward the substrate; and
   a heat transmission part located between the pixel parts, and having a first surface directly contacted with the protection part at a location opposing to the indented part of the protection part and a second surface directly contacted with the substrate.

2. The light emitting panel of claim 1, wherein the indented part is separated from the substrate.

3. The light emitting panel of claim 1, wherein the heat transmission part is in contact with the indented part of the protection part.

4. The light emitting panel of claim 1, wherein the heat transmission comprises a thermal pad.

5. The light emitting panel of claim 4, wherein the heat transmission part comprises a getter.

6. The light emitting panel of claim 1, wherein the protection part comprises either a metal, a glass or a plastic.

7. The light emitting panel of claim 1, wherein the pixel section emits a white color.

8. The light emitting panel of claim 7, wherein the pixel section comprises a sub-pixel.

9. The light emitting panel of claim 8, the sub-pixel comprises an emission part comprising an organic material disposed between two electrodes.

10. A light source comprising:
    a substrate;
    pixel parts divided from each other, formed on the substrate;
    a protection part comprising an indented part, wherein both ends of the protection part are coupled with the substrate on which the pixel parts are formed by sealants so that a space is for med between the pixel parts and the protection part, and the indented part is concaved corresponding to areas between the pixel parts toward the substrate; and
    a heat transmission part located between the pixel parts, and having a first surface directly contacted with the protection part at a location opposing to the indented part of the protection part and a second surface directly contacted with the substrate.

11. The light source of claim 10, wherein the indented part is separated from the substrate.

12. The light source of claim 10, wherein the heat transmission part is in contact with the indented part of the protection part.

13. The light source of claim 10, wherein the heat transmission comprises a thermal pad.

14. The light source of claim 13, wherein the heat transmission part comprises a getter.

15. The light source of claim 10, wherein the protection part comprises either a metal, a glass or a plastic.

16. The light source of claim 10, wherein the pixel section emits a white color.

17. The light source of claim 16, wherein the pixel section comprises a sub-pixel.

18. The light source of claim 17, the sub-pixel comprises an emission part comprising an organic material disposed between two electrodes.

19. The light source of claim 16, the light source is used for a light apparatus or a back light unit.

\* \* \* \* \*